United States Patent [19]
van de Plassche et al.

[11] Patent Number: 5,189,422
[45] Date of Patent: Feb. 23, 1993

[54] ANALOG-TO-DIGITAL CONVERTER WITH DELAY CORRECTION

[75] Inventors: Rudy J. van de Plassche; Petrus G. M. Baltus, both of Eindhoven, Netherlands

[73] Assignee: U.S. Philips Corporation, New York, N.Y.

[21] Appl. No.: 788,410

[22] Filed: Nov. 6, 1991

[30] Foreign Application Priority Data

Nov. 9, 1990 [NL] Netherlands ............... 9002445

[51] Int. Cl.⁵ .................. H03M 1/36; H03M 1/06
[52] U.S. Cl. ............................. 341/159; 341/118
[58] Field of Search ............... 341/118, 155, 159

[56]          References Cited
          U.S. PATENT DOCUMENTS

| 2,876,418 | 3/1959 | Villars | 332/1 |
| 3,050,713 | 8/1962 | Harmon | 341/160 |
| 4,393,368 | 7/1983 | Rasmussen | 341/156 |
| 4,897,656 | 1/1990 | van de Plassche et al. | 341/159 |
| 4,908,621 | 3/1990 | Polonio et al. | 341/120 |

Primary Examiner—Marc Hoff
Attorney, Agent, or Firm—Michael E. Marion

[57] ABSTRACT

Analog-to-digital converter operating in parallel having an analog signal input and a number of digital signal outputs, comprising a plurality of comparators having each two inputs and one output, one input being connected to an impedance network for supplying this one input with its own predetermined reference voltage, and the second input being connected to the analog signal input for receiving an analog input signal to be converted, so that each of the comparators processes a predetermined input signal portion. The comparator outputs are coupled to corresponding digital signal outputs, while delay elements are inserted between the comparator outputs and the corresponding digital signal outputs for causing a delay to occur related to the steepness of the slope of the input signal portion of the relevant comparator.

8 Claims, 4 Drawing Sheets

ANALOG-TO-DIGITAL CONVERTER WITH DELAY CORRECTION

BACKGROUND OF THE INVENTION

The present invention relates to an analog-to-digital converter operating in parallel and comprising a plurality of comparators in which each first comparator input is connected to an impedance network for supplying each of the comparators with its own predetermined reference voltage, and each second comparator input is connected to the analog signal input of the converter, the outputs of the comparators being connected to a corresponding number of digital signal outputs.

Such an analog-to-digital converter is described, for example, by J. Lambrechts in the article entitled "Optimale parallel-conversie door track/hold's", published in Electronica 85/7 (1985), pp. 23-27. In this prior-art converter the digital signal outputs are connected to an m-to-n converter which converts the digital signals at the m signal outputs to a digital word of n-bits, where $m=2^n$. In this article the fact is pointed out that variation of sample delays constitutes a potential source of dynamic conversion errors in such analog-to-digital converters operating in parallel. The separate comparators have each a certain delay determined by the internal asymmetry in the two comparator branches, the lay out of the chip in which the comparator is structured and the sample rate at which the analog input signal is sampled. The delay is generally different for each of the comparators. The resultant sample delay differences between the adjacent comparators generally do not form a serious problem to low-frequency analog signals. However, if the frequency of the analog input signal increases, the differences between the various sample delays may result in missed codes and an extremely high differential non-linearity. The consequent errors depend on the length of the rise time and on the direction of the edge of the analog input signal.

Variations of the slope of a signal applied to the analog input sections of the comparators will lead, more specifically, to second or third-order distortions of the input signal as a result of the bandwidth limitation that holds for each of these analog sections.

It is an object of the invention to indicate in what manner the disadvantages resulting from the variation in sample delays can be reduced or eliminated with relatively simple means.

SUMMARY OF THE INVENTION

This object is achieved with a converter of the type mentioned in the preamble in that delay elements are inserted between the comparator outputs and the corresponding digital signal outputs, which elements cause a delay to occur during operation which delay depends on the steepness of the slope of the input signal portion to be processed by the relevant comparator.

It should be observed that the use of delay elements in an analog-to-digital converter has already been known, for example, from British Patent Specification 1,384,576. The converter described there, however, operates according to the series principle in which the analog input signal is converted into a digital output signal and an analog residual signal in a number of steps. Therefore, the digital output signals become available at sequentially successive instants determined by the serial process adopted in this converter. This is considered a disadvantage and for eliminating this disadvantage delay lines are used so that, eventually, be it after a universal delay, all bits become available simultaneously.

BRIEF DESCRIPTION OF THE DRAWINGS

The invention will be described in more detail hereinbelow with reference to the annexed drawing figures, in which.

DETAILED DESCRIPTION OF PREFERRED EMBODIMENTS OF THE INVENTION

Figure 1:
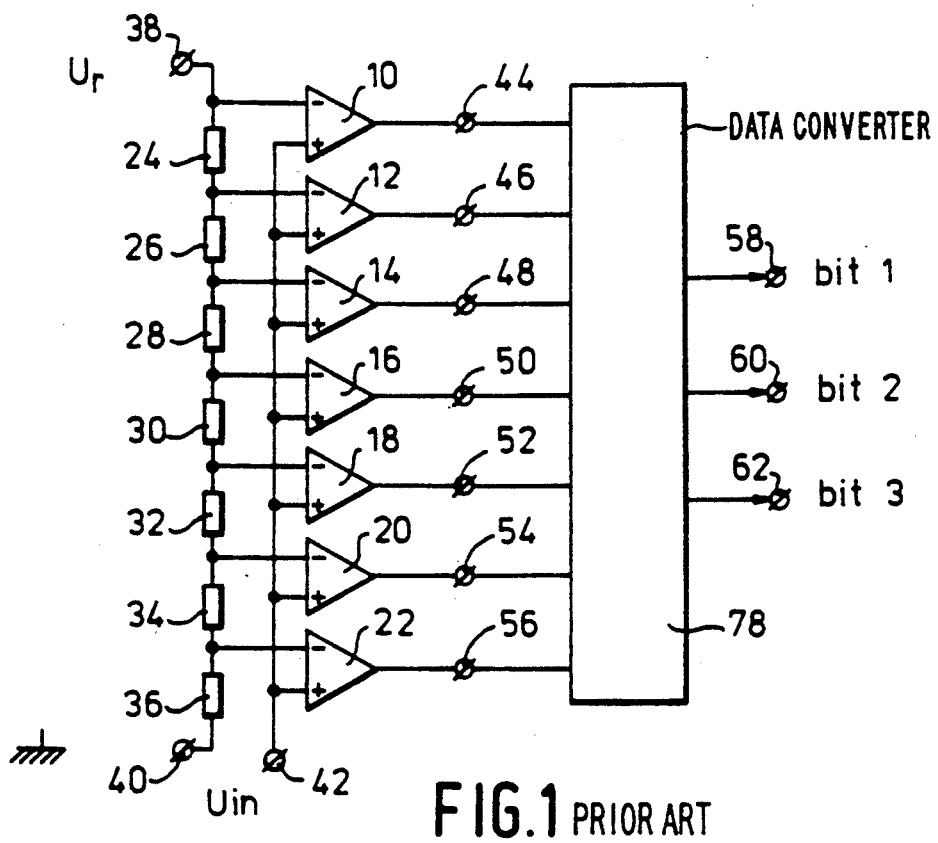
FIG. 1 shows an analog-to-digital converter according to the state of the art.

The prior-art analog-to-digital converter shown in FIG. 1 is an 8-step converter comprising 7 comparators 10, 12, 14, 16, 18, 20, 22 having each a first input connected to the input terminal 42 at which the analog input voltage Uin to be converted is presented, and having each a second input connected to a resistor array. This resistor array is arranged as a series combination of the resistors 24, 26, 28, 30, 32, 34 and 36, which series combination is connected between the voltage terminals 38 and 40. When in operation, for example, the ground potential is presented at the voltage terminal 40, whereas the reference voltage $U_r$ is presented at the voltage terminal 38.

The outputs of the comparators 10 . . . 22 are connected each to one of the digital signal outputs 44, 46, 48, 50, 52, 54, 56. In this embodiment these signal outputs 44 . . . 56 are connected to corresponding inputs of an 8-to-3 converter 78. The outputs of this converter 78 are referenced 58, 60, 62. With the aid of this converter 78 the 8 digital input signals are coded into a 3-bit word whose 3 bits are made available at the outputs 58, 60 and 62.

During operation the analog input signal Uin to be converted is applied to terminal 42, whereas the reference signal $U_r$ is applied to terminal 38, while it is assumed that the terminal 40 is connected to ground potential. The reference voltage $U_r$ is divided into separate reference voltages for the various comparators through the resistor array comprising the resistors 24 . . . 36. In the various comparators the input voltage Uin is compared to each separate reference voltage which results in an output signal having a first or second value. The output signals of the comparators are sampled by means of a sample signal applied to sample inputs (not shown) of the various comparators, so that the signals at the outputs 44 . . . 56 can be converted into a 3-bit word at the outputs 58, 60, 62 by the converter 78. The detailed operation of a circuit illustrated in FIG. 1 is assumed to be known to those skilled in the art and will not be discussed any further.

Each of the comparators 10 ... 22 examines a different portion of the input signal. The comparators near to the ends of the comparator array, such as the comparators 10 and 22, in essence examine a portion of the input signal having a relatively flat slope, whereas the comparators near to the middle of the comparator array, such as, for example, comparator 16, examine a portion of the input signal having a relatively steep slope. The fact that the various comparators are supplied with parts of the input signal Uin having different slopes leads to a distortion which is expressed by the sampled signals at the signal outputs 44 ... 56.

Figure 2:
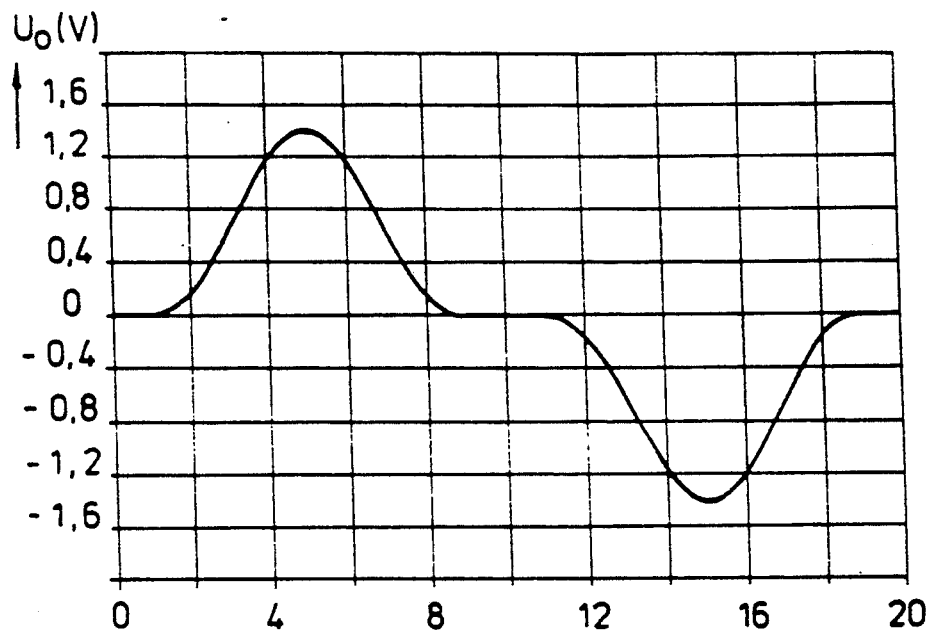
FIG. 2 shows the results of the simulated 0-crossings with a 64-step analog-to-digital converter.
Figure 3:
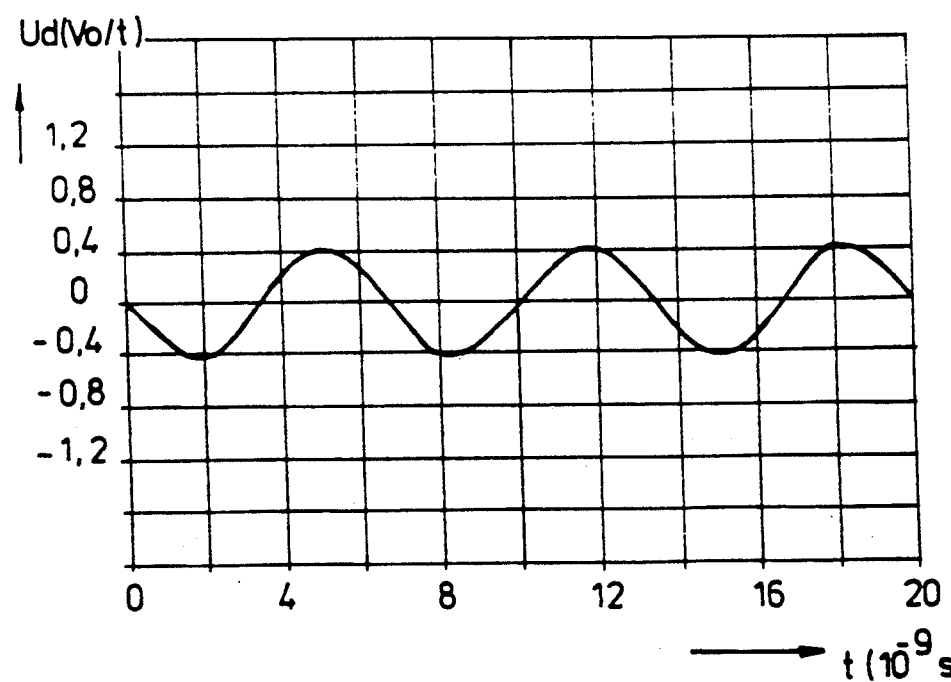
FIG. 3 shows the third-order distortion occurring in the simulation, obtained by taking the difference between the simulated output signal of FIG. 2 and the original sine-shaped input signal.

FIG. 2 shows the results of a computer simulation on the basis of a 64-step converter to which a sine-shaped input signal Uin having an amplitude of 0.5 V and a frequency of 50 MHz is applied, together with a 1 V reference signal $U_r$. The input signal is sampled two hundred times (sample rate 10 GHz) within a period of time of $20 \cdot 10^{-9}$ sec., which corresponds to a complete sine period of the input signal. If these samples are then plotted in a graph, FIG. 2 will be obtained. FIG. 2 shows a time scale in steps of $2 \cdot 10^{-9}$ sec. plotted along the horizontal axis, whereas the resulting output voltage $U_o$ is plotted along the vertical axis in steps of 0.4 V. As apparent from FIG. 2 there is a considerable distortion in a signal having such a high freqency. If the difference is taken between the original sine-shaped input signal and the output signal shown in FIG. 2, the distortion will remain. The distortion Ud is illustrated in FIG. 3 in which the same graduation as in FIG. 2 is used for the horizontal and vertical axes. As apparent from FIG. 3 the distortion is in essence third-order distortion. This distortion may be largely eliminated by inserting delay elements between the various signal outputs 44 ... 56 and the outputs of the comparators 10 ... 22. The configuration then developed is illustrated in FIG. 4.

Figure 4:
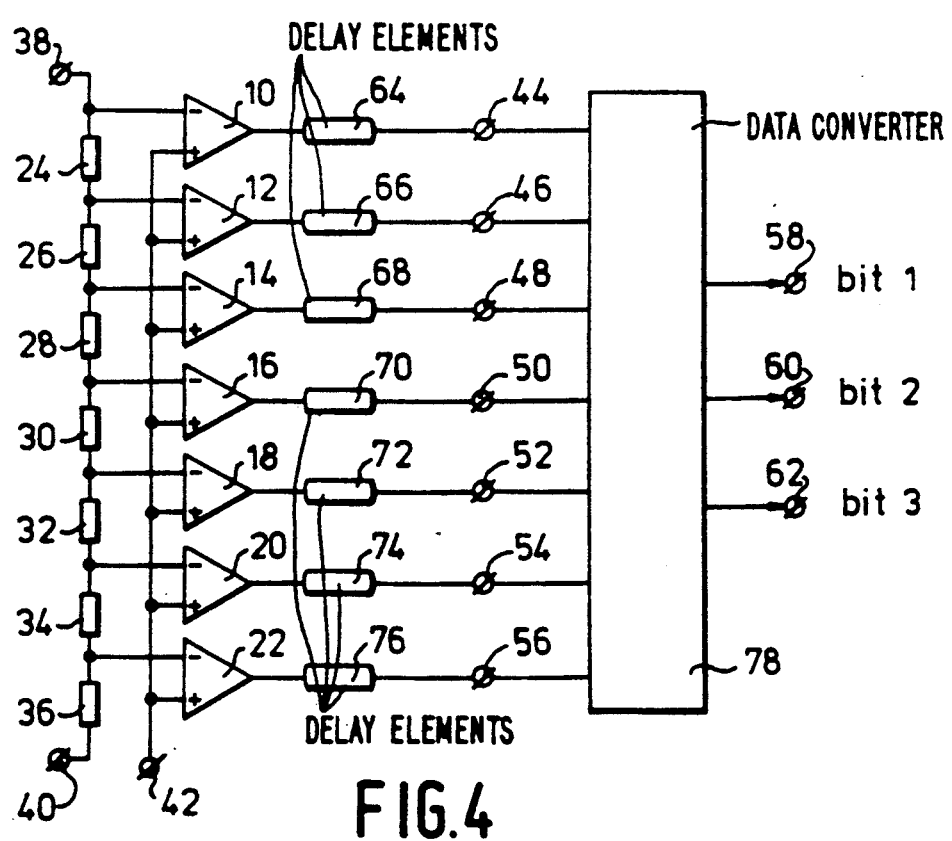
FIG. 4 shows an analog-to-digital converter according to the invention.
Figure 5:
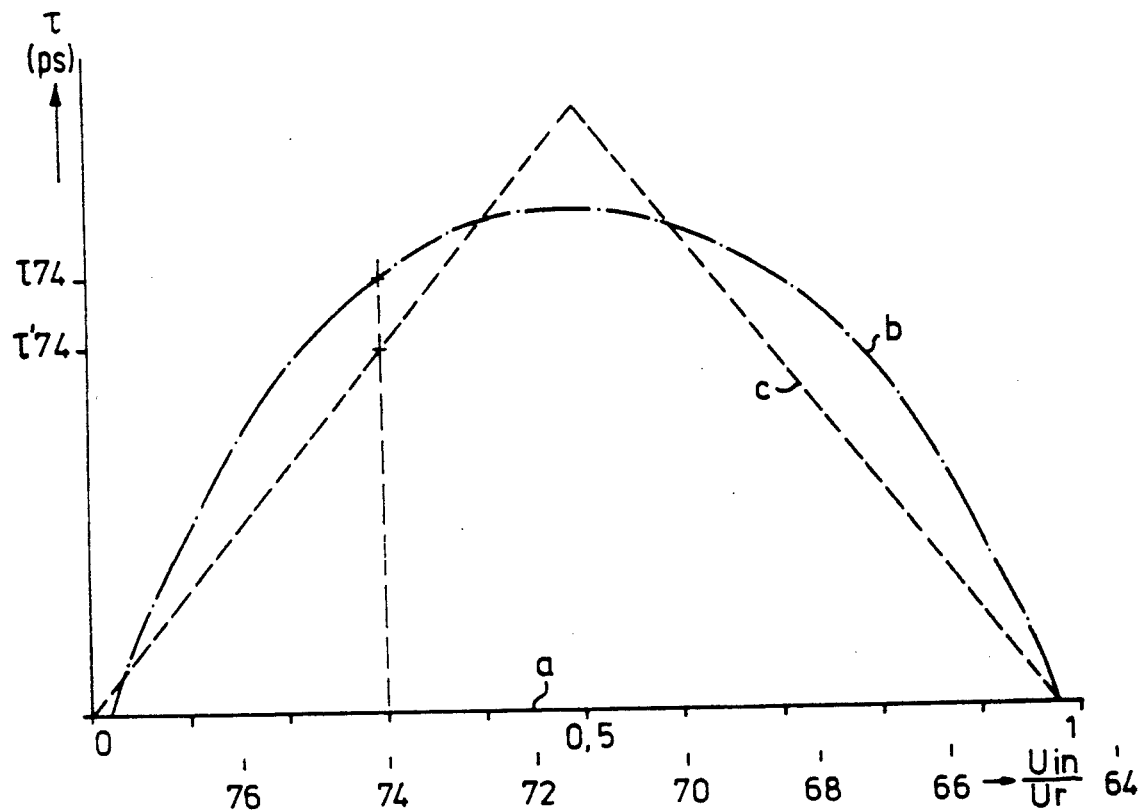
FIG. 5 shows several diagrams for the selection of the delays to be realised by the different delay elements.

The circuit according to the invention illustrated in FIG. 4 comprises a large number of components which are fully identical with the components illustrated in FIG. 1. These components are denoted by identical reference numerals. The difference between FIGS. 1 and 4 can be found in the extension by the delay elements 64, 66, 68, 70, 72, 74 and 76 each time between the output of a comparator and the associated digital signal output. The delays realised by the delay elements 64 ... 76 are mutually individually dependent on the average steepness of the slope of the signal portion to be processed by the associated comparator. The steeper the signal to be processed by the comparator, the larger the required delay of the associated delay element will have to be. FIG. 5 shows the number of possible graphs for determining the delay of a specific delay element.

FIG. 5 shows plotted along the horizontal axis the ratio of the input signal Uin and the reference signal $U_r$. This scale, running from 0 to 1, corresponds in fact to the location of the relevant delay element in the array of delay elements. The delay element 64 will not be activated until the input voltage Uin is equal to the reference voltage. The remaining delay elements will be activated with ever-reducing input voltages. Therefore, beneath the horizontal axis there is shown by way of reference when the relevant delay elements are activated. Along the vertical axis there is shown how much the delay $\tau$ of the relevant delay element measured in picoseconds ought to be. If the parabolic distribution b is started from, the delay for the delay element 74 will be, for example, $\tau_{74}$. If the triangular distribution c is started from, however, the delay element 74 has a delay of $\tau'_{74}$. A suitable delay can be determined for each of the other delay elements in similar fashion, depending on the selected distribution graph. The results that can be achieved with the distribution schemes shown are illustrated in the FIGS. 6, 7 and 8.

Figure 6:
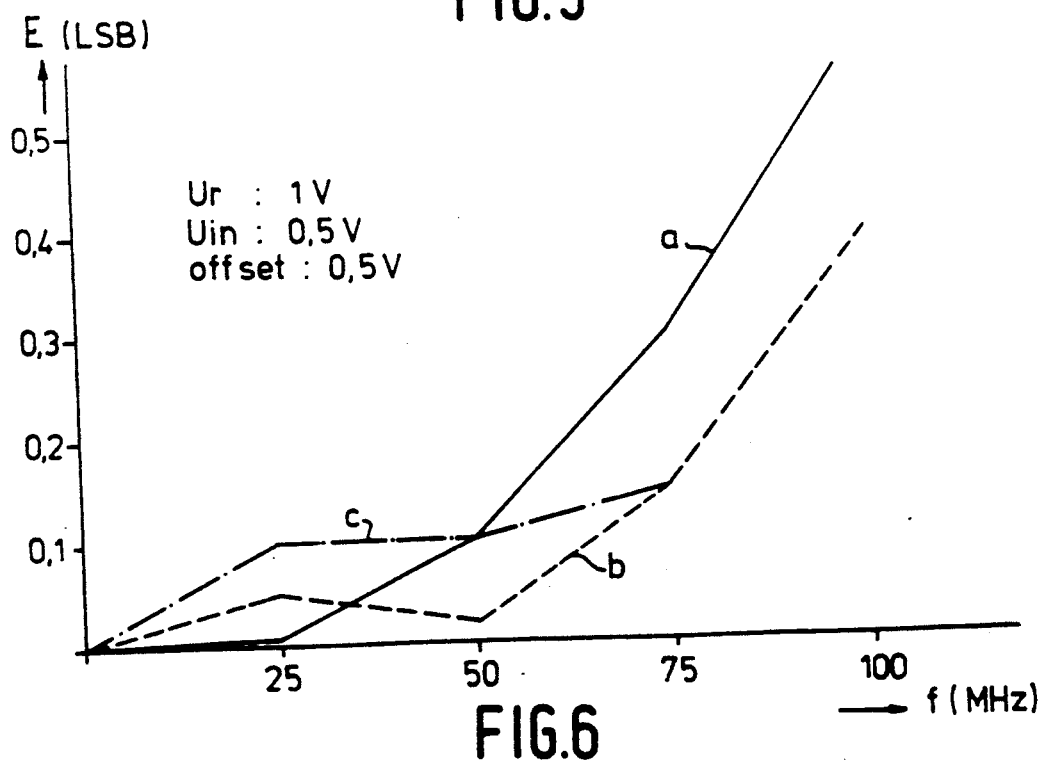
FIG. 6 illustrates the reduction of the sampling error resulting from the use of the delay elements according to the invention, more specifically, at higher rates and with relatively high input signals.

In FIG. 6, plotted along the horizontal axis, is the frequency f expressed in MHz, whereas the sampling error E occurring in a converter is plotted along the vertical axis and expressed as part of the least significant bit LSB. In FIG. 6 a sine-shaped signal having an amplitude of 0.5 V and and an offset of 0.5 V (relative to the zero voltage terminal 40) is started from. As appears from FIG. 6 a 0.1 LSB error occurs with a frequency of 50 MHz and the error has risen to 0.3 LSB with 75 MHz, whereas the error even amounts to 0.6 LSB with 100 MHz. If the delay elements are incorporated and the parabolic scheme b is used for selecting the delays of these elements, the error made during the conversion will behave according to the curve denoted by a dashed line b in FIG. 6. This shows that with 50 MHz the error is considerably smaller than 0.1 LSB, has increased to 0.15 LSB with 75 MHz and has increased to 0.4 LBS with 100 MHz. If the triangular distribution graph c shown in FIG. 5 is used, the error in the low-frequency range becomes somewhat larger, as appears from FIG. 6, but in the higher frequency area between 75 and 100 MHz, the curves c and b coincide and this brings about a marked advantage relative to the curve a (without delay elements).

FIG. 6 therefore distinctly shows that the extension by the delay elements between the outputs of the comparators and the digital signal outputs provides a considerable advantage, more specifically, in the high-frequency area. However, an additional error will arise in the low-frequency area, but this error with 0.1 LSB generally remains amply within the permissible tolerance limits. In general it may therefore be stated that the extension by the delay elements leads to an increase of the useful bandwidth of the converter.

Figure 7:
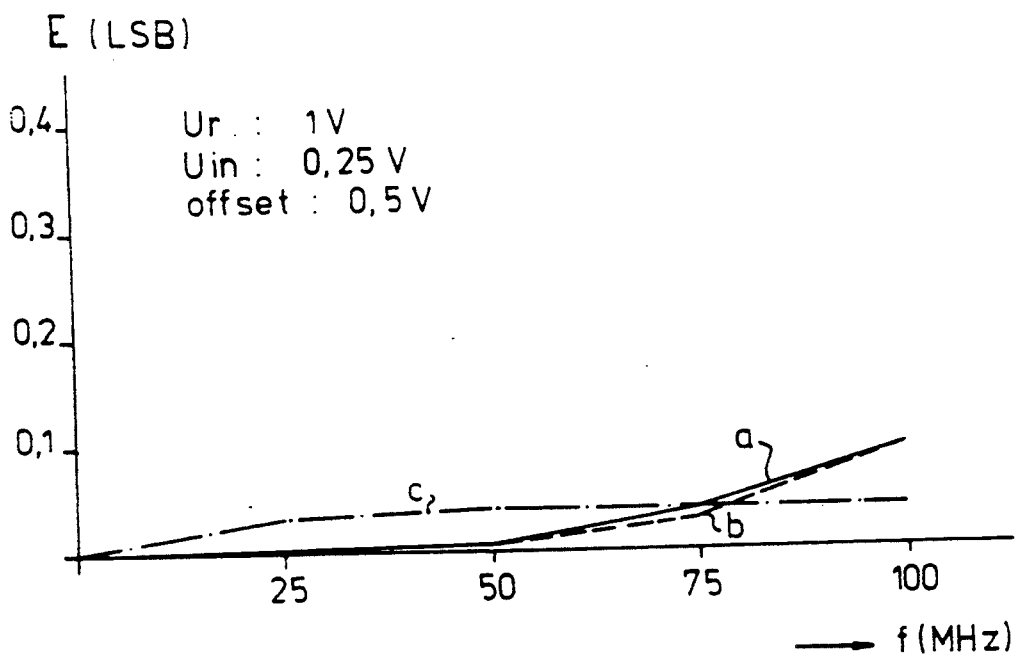
FIGS. 7 and 8 illustrate the effect on the sampling error resulting from the use of delay elements according to the invention, more specifically, with signals having a lower amplitude and different offset.

FIG. 7 shows the variation of the sampling error E plotted against frequency for a smaller input signal, that is to say, a signal having an amplitude of 0.25 V and an offset of 0.5 V. The choice of the parabolic curve b does not prove to be advantages relative to a total lack of delay lines (curve a), the choice of the triangular curve c does result in a somewhat larger error rate with low frequencies, but also a relatively smaller error rate with high frequencies. In general, however, the error remains below 0.1 LSB.

Figure 8:
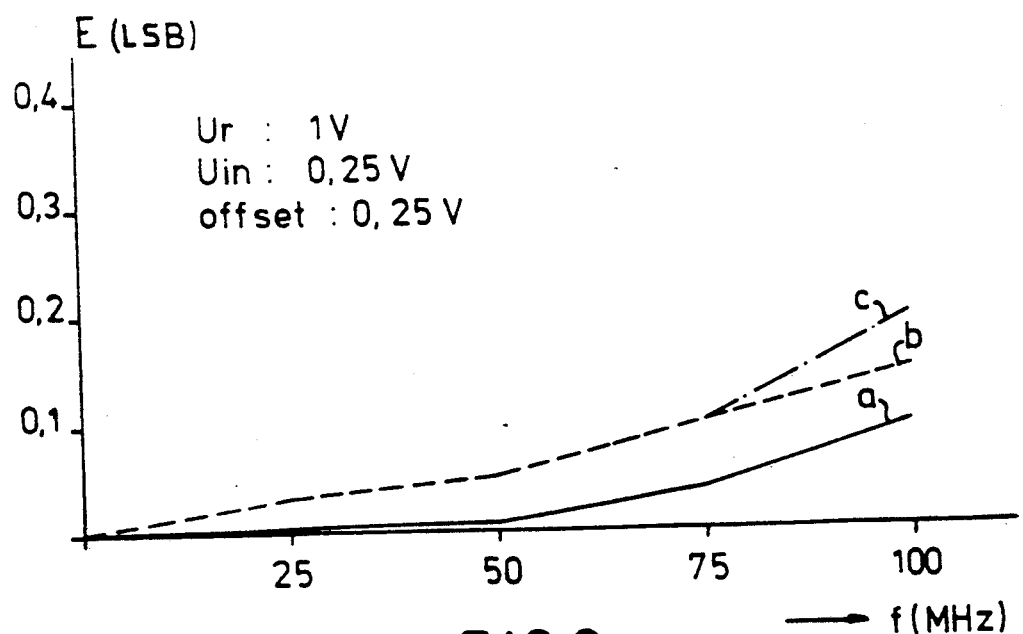

FIG. 8 shows the situation for a 0.25 V input signal having a smaller offset, that is, 0.25 V. Under these circumstances a somewhat higher sampling error E is obtained throughout the line, which error is enhanced to 0.15 LSB with 100 MHz in the higher frequency area for curve b and to 0.2 LSB with 100 MHz for the triangular curve c.

Summarizing it may be stated that the extension by the delay elements may produce a relative deterioration of the sampling error, it is true, with relatively small signals, but may show a considerable improvement of the sampling error with relatively large signals, more specifically, with higher frequencies.

The delay which is to be realized with the delay elements 64 ... 76 are so small (cf. also FIG. 5) that short stubs can be used for realizing the delay elements. Assuming that a stub having a length of 100 μm produces a signal delay of 1 psec, it may be assumed that the maximum required length of a delay line in analog-to-digital converter according to the invention will be about 1 mm. Stubs of such lengths can be realized with little difficulty in an integrated circuit.

It should be observed that in the above an 8-step (3-bit) converter (FIG. 4) and a 64-step (6-bit) converter (computer simulation) are referred to by way of example. However, it will be evident that the invention is not restricted to these examples and may be used for converters having an arbitrary number of steps. Furthermore, it should be observed that the signals at the digital signal outputs may also be processed by different types of converters or circuits from the above m-to-n converters.

We claim:

1. Analog-to-digital converter operating in parallel having analog signal input and a number of digital signal outputs, comprising a plurality of comparators having each two inputs and one output, one input being connected to an impedance network for supplying this one input with its own predetermined reference voltage, and the second input being connected to the analog signal input of the converter for receiving an analog input signal to be converted, so that each of the comparators processes a predetermined input signal portion, the comparator outputs being coupled to corresponding digital signal outputs, characterized in that delay elements are inserted between the comparator outputs and the corresponding digital signal outputs for causing a delay to occur related to the steepness of the slope of the input signal portion of the relevant comparator.

2. Analog-to-digital converter operating in parallel as claimed in claim 1, characterized in that, seen in the direction from the comparator producing the least significant digital signal to the comparator producing the most significant signal, the delay of the elements first increases and then decreases again.

3. Analog-to-digital converter operating in parallel as claimed in claim 2, characterized in that the delay in said directions increases and decreases as a linear function.

4. Analog-to-digital converter operating in parallel as claimed in claim 3, characterized in that the delay elements are formed by stubs having lengths adapted to the desirable delay.

5. Analog-to-digital converter operating in parallel as claimed in claim 2, characterized in that the delay in said direction decreases as a parabolic function.

6. Analog-to-digital converter operating in parallel as claimed in claim 5, characterized in that the delay elements are formed by stubs having lengths adapted to the desirable delay.

7. Analog-to-digital converter operating in parallel as claimed in claim 2, characterized in that the delay elements are formed by stubs having lengths adapted to the desirable delay.

8. Analog-to-digital converter operating in parallel as claimed in claim 1, characterized in that the delay elements are formed by stubs having lengths adapted to the desirable delay.

* * * * *